June 29, 1971 R. J. GALLI 3,589,000
METHOD FOR ATTACHING INTEGRATED CIRCUIT CHIPS
TO THICK FILM CIRCUITRY
Filed Jan. 13, 1969 3 Sheets-Sheet 1

INVENTOR
RICHARD J. GALLI
BY John J. Klocko III
ATTORNEY

INVENTOR
RICHARD J. GALLI
BY John J. Klocko III
ATTORNEY

INVENTOR

RICHARD J. GALLI

BY *John J. Klocko III*

ATTORNEY

United States Patent Office 3,589,000

Patented June 29, 1971

3,589,000

METHOD FOR ATTACHING INTEGRATED CIRCUIT CHIPS TO THICK FILM CIRCUITRY

Richard J. Galli, Glen Mills, Pa., assignor to E. I. du Pont de Nemours and Company, Wilmington, Del.

Filed Jan. 13, 1969, Ser. No. 790,734
Int. Cl. B01j *17/00;* H01l *7/24*
U.S. Cl. 29—590 5 Claims

ABSTRACT OF THE DISCLOSURE

The novel process involves a unique step of mechanically forming metallic coatings to a precise geometry to provide coplanar lands and/or pedestal terminations for bonding to integrated circuit chips. This process utilizes thick film technology which features significant time-saving and cost advantages.

BACKGROUND OF THE INVENTION

In the past, integrated circuit chips have been prepared wherein such a chip usually includes a plurality of active elements such as transistors, resistors, capacitors and the like, intercoupled in an integral manner on a single silicon chip. Each chip is packaged individually in containers such as cans or flat-packs, or mounted directly to hybrid packages. Individual leads are connected to the packaged chip for connection to exterior circuitry. However, packaging containers are relatively expensive, and conventional chip packaging techniques are costly.

Recently, U.S. Patent 3,391,451 disclosed a method wherein an integrated circuit chip is directly affixed to a circuit substrate, utilizing thin film circuitry. However, it is well known that a thin film process is expensive, requires sophisticated equipment and requires smooth and highly polished substrates. Due to the high commercial costs and great degree of technical competence required, a better replacement for thin film circuitry is desirable.

Heretofore, thick film circuitry could not be utilized since the required printing resolution had not been obtainable and mechanical techniques of forming thick film pedestals or lands were not available. This invention has been developed to overcome these deficiencies and provide techniques which utilize thick film circuitry for direct attachment of integrated circuit chips to ceramic substrates containing circuitry.

SUMMARY OF THE INVENTION

This invention relates to a method of producing an electronic circuit unit comprising:

(a) Providing a ceramic substrate and registering said substrate with a securing means;

(b) Applying a thick film metallic coating onto selected portions of said substrate;

(c) Optionally, screen printing pedestal portions onto said coating by one or more successive printing applications;

(d) Firing the entire substrate assembly;

(e) Mechanically forming coplanar lands in the attachment area of said metallic coating, and if step (c) is performed, also mechanically forming the pedestals to a precise geometry;

(f) Providing an integrated circuit chip having conductive portions thereon corresponding in location for mating with said coplanar lands and/or pedestal portions;

(g) Positioning said circuit chip on said substrate with the conducting portions in alignment with said coplanar lands and/or pedestal portions; and (h) Bonding said integrated circuit chip to said substrate, whereby said conductive portions are juxtaposed with and adherent to said coplanar lands and/or pedestal portions.

In addition, electronic circuit units made by the above process are also part of this invention since, heretofore, such units have not been made directly utilizing thick film technology.

BRIEF DESCRIPTION OF THE DRAWINGS

FIG. 2(*a*) is an enlarged cross-sectional view of the pedestals on line 2A of FIG. 2;

FIG. 3(*a*) is an enlarged cross-sectional view of the tool cavities on line 3A of FIG. 3;

FIG. 3(*b*) is a top view of a substrate including the pedestals which have undergone impact coining;

DESCRIPTION OF THE PREFERRED EMBODIMENTS

Figure 1:
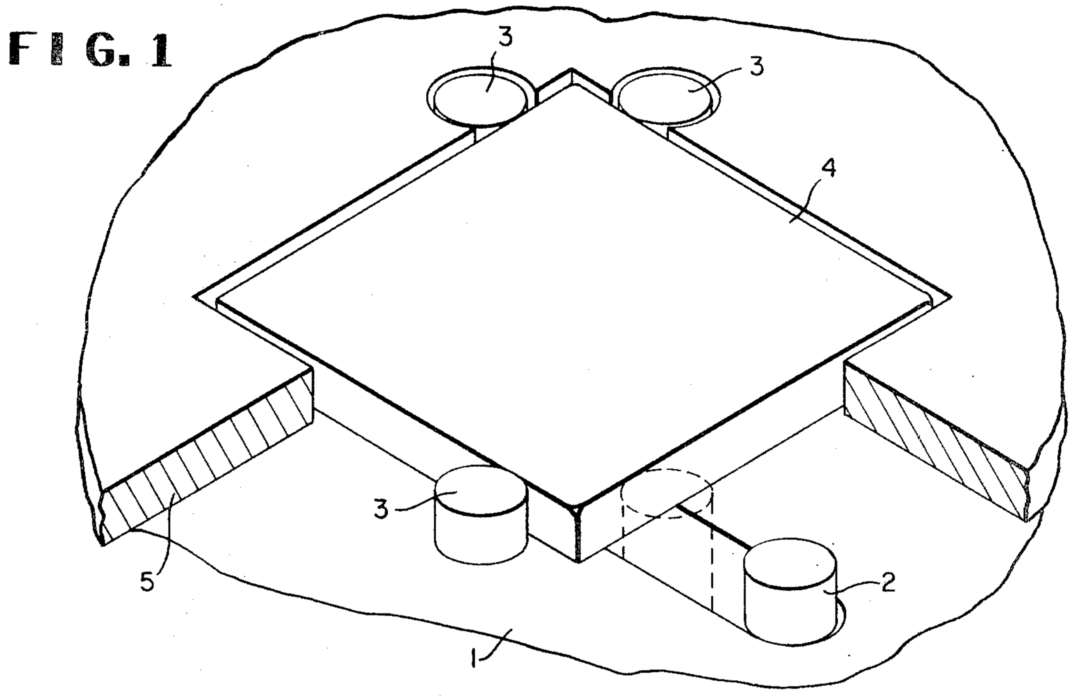
FIG. 1 is a perspective view of a registry chuck.

The initial step of the process involves providing a thick film compatible substrate and registering the substrate with a securing means. It is very important that a proper substrate material be used and also that the substrate is properly registered so that it may be positioned and repositioned throughout the process of this invention. Any of the conventional substrates which are compatible with thick film circuitry such as alumina, barium titanate, strontium titanate, porcelain glass, etc. may be used as the substrate material, although ceramic substrates are preferred and sometimes critical to the production of thick film circuitry. Proper registration of the substrate must be made so that all the operations of the process can be carried out at exactly the same location. A suitable mode is shown in FIG. 1 where a three-pin chuck is utilized. Of course, various other means and chuck arrangements can be utilized as long as they provide proper registration of the substrate.

Step (b) involves applying a metallic coating onto selected portions of the substrate. Generally, this can be accomplished by screen printing a metallic paste by conventional thick film techniques. Any of the well known metallizations which contain finely divided metal particles, inorganic binder and liquid vehicle may be utilized. Of particular importance, are the metallizations containing precious metals, including silver, gold, platinum, palladium, ruthenium and rhodium. Typical metallizations are disclosed in U.S. 3,305,799 and 3,347,799.

Step (c), which involves applying pedestal portions onto said coating by one or more successive printing applications, is optional. For example, for conventional integrated circuits, it is desirable to elevate the active surface above the substrate circuitry. For this reason, pedestals are formed on the ceramic substrate to accommodate these integrated circuits. However, flip chip or beam lead integrated circuits having integral thick terminals are automatically elevated above the substrate when attached and do not require substrate pedestals. Therefore, when using the latter, thick film conductor lines are coined to form coplanar lands in the attachment area of the integrated circuit.

For each different integrated circuit pattern, there is usually an optimum pedestal height which will produce the desired geometry and bonding characteristics. The pedestals are formed at predetermined locations which will align with the terminals of the integrated circuit. Generally, the pedestals will be formed at the ends of the conductive lines by dispensing a metallizing paste through a stencil. Printing with a viscous paste simplifies pedestal laydown. Suitable metallizations include those specifically prepared for this purpose or any of the conventional metallizations described above.

The next step requires firing the entire assembly. Actually, the sequence of firing is optional and can be carried out at various stages prior to this time in the process. For example, the conductive patterns may be fired prior to depositing pedestals on top of the conductor lines, or in the alternative, the pedestals may be printed and air dried in successive applications and then cofired with the conductor patterns. Regardless of the sequence of firing, a firing operation must be carried out at this point before any further mechanical processing is performed.

Figures 3, 3A, 3B:
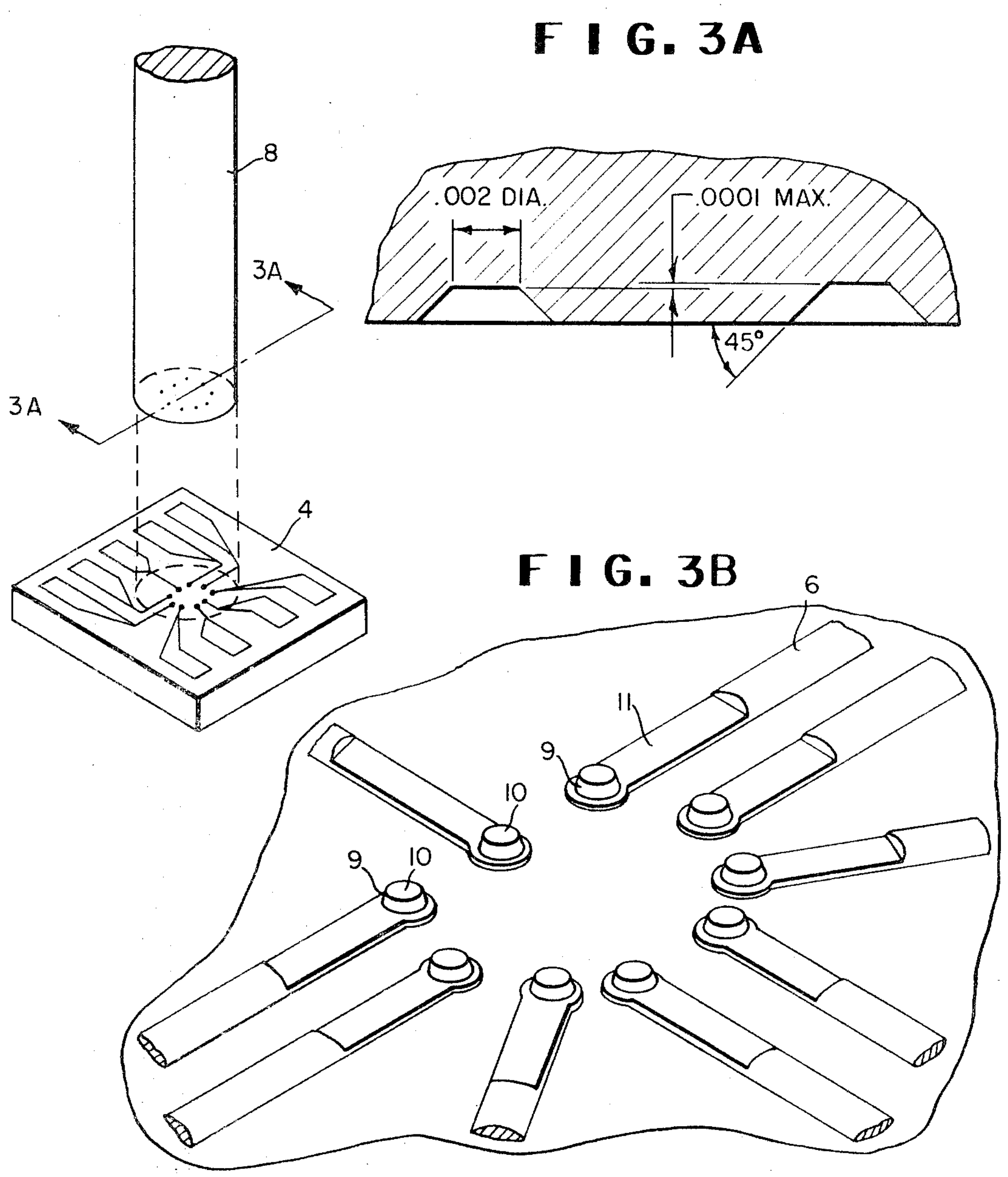
FIG. 3 is a perspective view of the impact coining tool.

Step (e) involves mechanically forming: the pedestals to a precise geometry, or conductor lines to coplanar lands. This is a very important step which requires the use of precision techniques. A special tool can be used to form the pedestals into precise geometric configurations which are level and have top surface areas sized to permit proper bonding of the integrated circuit chip despite minor misalignment. One desirable method is by the use of an impact coining tool as shown in FIG. 3. While other methods and means may be utilized to mechanically form the pedestals (e.g., multiple impacting, application of vibratory energy, thermocompression, etc.), the coining method has proven to be the best procedure and critical in some instances to successful operation of this invention.

This invention is not limited to the particular coining tool shown in FIG. 3. Various cavity designs may be utilized in coining tools. For example, conical, cylindrical, spherical, etc., cavities will produce good pedestals. In automatic attachment operations utilizing "bumped" flip chips, coining alignment recesses in the substrate pedestals will simplify integrated circuit registration by providing recesses into which flip chip terminals will automatically self align.

The final steps involve providing an integrated circuit chip and positioning the circuit chip on the substrate with the conducting portions of the chip in alignment with the pedestal portions of the substrate. This can be accomplished by well-known techniques provided that the proper registry of the substrate is always maintained. The integrated circuit chip and the substrate are then bonded whereby the conductive portions of the chip are juxtaposed with and adherent to the pedestal portions of the substrate. Any suitable means of bonding may be utilized (e.g., thermocompression), but the preferred method is through the use of ultrasonic bonding. Application of ultrasonic energy of the proper frequency, power and duration will effect strong bonds and leave the chip undegraded.

A more complete understanding of the invention can be made from a study of the drawings. Referring to FIG. 1, there is shown a registry chuck comprising chuck base 1, loading pin 2 and registry pins 3. A substrate 4, such as alumina is positioned between the three registry pins and loaded via loading pin 2. An optional printing mask support 5, is also positioned around the registry chuck.

Figures 2, 2A:
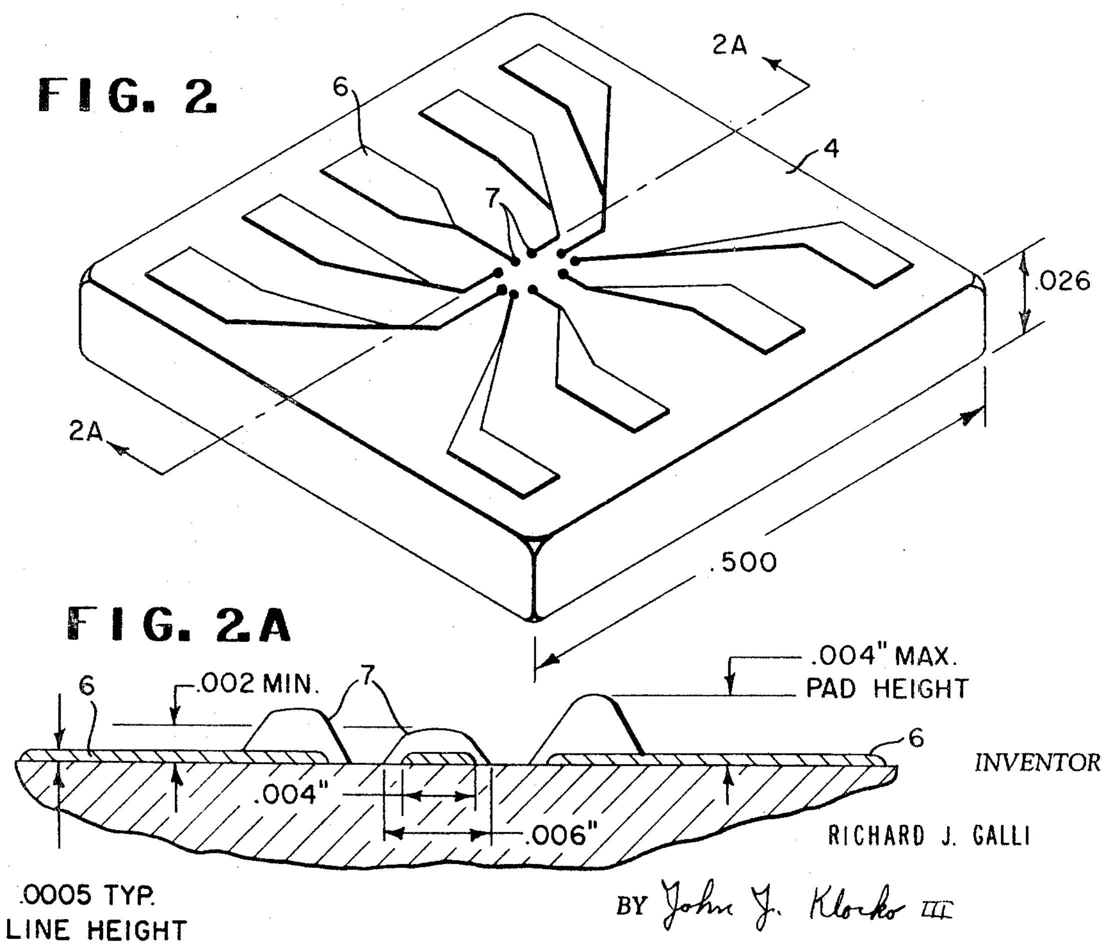
FIG. 2 is a perspective view of a substrate including a printed conductor pattern and printed pedestals.

In FIG. 2, a nine-line conductor pattern 6 was applied by screen printing a metallizing composition in the desired pattern. The metallizing composition comprised, in weight percent, approximately 86% silver, 8% platinum, and 6% of a lead-borosilicate glass frit dispersed in a liquid vehicle. The substrate was then removed from the chuck and fired during a 45-minute cycle to a maximum temperature of 850° C.; it was allowed to air cool and then re-registered in the same three-pin chuck. Next, terminal pedestals 7 (0.006 inch diameter at the base and approximately 0.003 inch high) were formed at the end of the conductive lines by dispensing the same metallizing composition through a 0.006 inch thick masking having 0.006 inch diameter holes at the proper locations. This is shown in FIG. 2. The entire assembly was then removed from the chuck, air-dried and refired in the same manner, to obtain the proper metallized condition. Pedestals in the printed condition were nonuniform, varying in width and height as shown in the enlarged cross-sectional view in FIG. 2(*a*).

A subsequent forming operation was carried out by mechanically coining with a special coining tool 8. This coining tool was a stainless steel mandrel having precision cavities formed in the tool surface, and located to correspond exactly to the integrated circuit terminal locations. Each cavity had an identical and definite geometry; the cavities were 0.001 inch deep, 0.002 inch diameter flat across the top, with 45° conical sides. The recess depth was uniform within 0.0001 inch total. This is shown in FIG. 3 and the corresponding tool cross-section FIG. 3(*a*).

The substrate, which had the printed and fired metallizations thereon, was secured in the three-pin chuck and the coining tool was impacted at approximately 0.7 foot sec. over the printed pads; the total coining tool travel was approximately 0.4 inch. The resulting deformation coined the pedestals into a well-defined, uniform geometry 9. At the same time, all the pedestals were leveled to a uniform height 10. Since the tool bottoms against the upper surface of the conductor lines, any spurious material which would cause short circuiting, in the area of the terminals, was flattened to form coplanar lands 11 0.001 inch below the pedestal tops. The patterns in this condition were ready for bonding as shown in FIG. 3(*b*).

Figure 4:
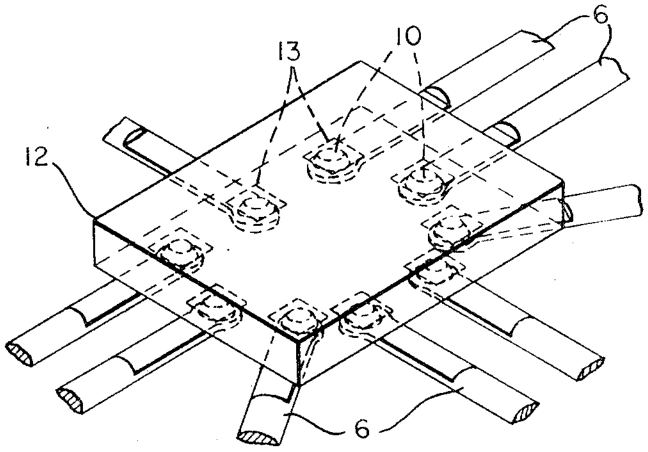
FIG. 4 is a perspective view of a typical integrated circuit positioned and aligned above the printed and coined conductor on a substrate.
Figure 5:
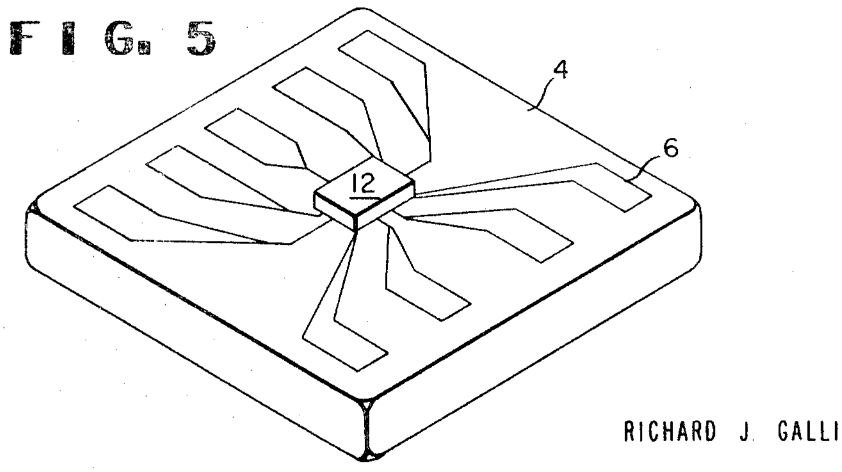
FIG. 5 is a perspective view of an integrated circuit bonded, face down, to a ceramic substrate having a conductive pattern thereon.

A split optical alignment system, which superimposes the images of the integrated circuit terminals 13 and the thick film pedestals 10 was used to position the integrated circuit chip 12, above the thick film pattern 6. This is shown in FIG. 4. The integrated circuit was bonded to the metallized alumina substrate with an ultrasonic bonding machine. An illustration of the finished product is shown in FIG. 5. It is pointed out that the number of terminal pads per integrated circuit or the number of integrated circuits per substrate is not to be limited by this specific embodiment; any practical number may be accommodated.

The electronic circuit units produced by the process of this invention were tested and evaluated to determine their mechanical and electric properties. A wide range of acceptable shear strength was observed in the bonded integrated circuit chips. The overall results indicated that conventional integrated circuits can be successfully bonded to thick film pedestals and wiring on ceramic substrates.

Therefore, this invention provides a process which utilizes inexpensive thick film technology to effect fine printing resolution of both the conductor configurations and the pedestals. More importantly, this invention involves a novel mechanical forming technique, not previously available in conjunction with thick film technology, to provide proper pedestal height, coplanarity, proper surface area (contact area) of the pedestals and proper geometrical positioning (spacing).

It is pointed out that although the discussion throughout the specification has been directed to attaching integrated circuits, this is not intended to limit the scope of this invention. Other semiconductors can be similarly attached. In particular, semiconductors which require coplanarity, such as transistors, can be attached via the process of this invention.

I claim:

1. A method of producing an electronic circuit unit comprising:

(a) providing a thick film compatible substrate and registering said substrate with a securing means;

(b) applying a thick film metallic coating onto selected portions of said substrate;

(c) screen printing pedestal portions onto said coating by one or more successive printing applications;
(d) firing the entire substrate assembly;
(e) mechanically forming coplanar lands in the attachment area of said metallic coating;
(f) providing a semiconductor having conductive portions thereon corresponding in location for mating with said coplanar lands and/or pedestal portions;
(g) positioning said circuit chip on said substrate with the conductive portions in alignment with said coplanar lands and/or pedestal portions; and
(h) bonding said integrated circuit chip to said substrate, whereby said conductive portions are juxtaposed with and adherent to said coplanar lands and/or pedestal portions.

2. A method in accordance with claim 1 wherein said bonding is effected through the use of ultrasonic energy.

3. A method in accordance with claim 1 wherein said semiconductor is an integrated circuit chip.

4. A method in accordance with claim 1 wherein said semiconductor is a transistor.

5. A method of producing electronic circuit units comprising:
(a) providing a ceramic substrate and registering said substrate with a securing means;
(b) screen printing a thick film metallic coating onto selected portions of said substrate;
(c) screen printing pedestal portions onto said coating by one or more successive printing applications;
(d) firing the entire substrate assembly;

(e) mechanically forming the pedestals to a precise geometry through the use of a coining tool;
(f) providing an integrated circuit chip having conductive terminal portions thereon corresponding in location for mating with said pedestal portions;
(g) positioning said circuit chip on said substrate with the conductive terminal portions in alignment with said pedestal portions; and
(h) ultrasonically bonding said integrated circuit chip to said substrate, whereby said conductive terminal portions are juxtaposed with and adherent to said pedestal portions.

References Cited

UNITED STATES PATENTS

| | | | |
|---|---|---|---|
| 2,484,671 | 10/1949 | Bauman | 101—124X |
| 3,006,069 | 10/1961 | Rhoads et al. | 29—578X |
| 3,330,026 | 7/1967 | Best et al. | 29—591X |
| 3,380,155 | 4/1968 | Burks | 29—591 |
| 3,391,451 | 7/1968 | Moore | 29—589X |
| 3,403,438 | 10/1968 | Best et al. | 29—589X |
| 3,470,611 | 10/1969 | McIver et al. | 29—590 |
| 3,475,814 | 11/1969 | Santangini | 29—589 |

JOHN F. CAMPBELL, Primary Examiner

R. B. LAZARUS, Assistant Examiner

U.S. Cl. X.R.

29—470.1, 471.1, 471.3, 482, 502, 591